(12) United States Patent
Ohta et al.

(10) Patent No.: US 9,269,735 B2
(45) Date of Patent: Feb. 23, 2016

(54) METHOD OF MANUFACTURING SOLID-STATE IMAGING DEVICE, SOLID-STATE IMAGING DEVICE, AND ELECTRONIC APPARATUS

(75) Inventors: Kazuo Ohta, Kanagawa (JP); Ikuo Yoshihara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 13/308,854

(22) Filed: Dec. 1, 2011

(65) Prior Publication Data

US 2012/0146173 A1 Jun. 14, 2012

(30) Foreign Application Priority Data

Dec. 8, 2010 (JP) .................. 2010-273706

(51) Int. Cl.
*H01L 27/146* (2006.01)
*H01L 27/12* (2006.01)

(52) U.S. Cl.
CPC ...... *H01L 27/14634* (2013.01); *H01L 27/1469* (2013.01); *H01L 27/14632* (2013.01); *H01L 27/14687* (2013.01); *H01L 27/1266* (2013.01); *H01L 27/1463* (2013.01); *H01L 27/14621* (2013.01); *H01L 27/14627* (2013.01)

(58) Field of Classification Search
CPC ..................... H01L 51/0024; H01L 27/14603
USPC ............................................ 257/443; 438/73
See application file for complete search history.

(56) References Cited

U.S. PATENT DOCUMENTS

| | | | | |
|---|---|---|---|---|
| 5,214,272 A | * | 5/1993 | Ueno .......................... 250/208.1 |
| 5,236,871 A | * | 8/1993 | Fossum et al. .................. 438/59 |
| 2001/0013898 A1 | * | 8/2001 | Bawolek ................ G02B 5/208 |
| | | | | 348/272 |
| 2003/0058376 A1 | * | 3/2003 | Zhang .............................. 349/43 |
| 2005/0219392 A1 | * | 10/2005 | Suzuki .......................... 348/294 |
| 2008/0224181 A1 | * | 9/2008 | Uya .............................. 257/228 |
| 2009/0065823 A1 | * | 3/2009 | Hwang ......................... 257/292 |
| 2009/0065827 A1 | * | 3/2009 | Hwang ......................... 257/292 |
| 2009/0108176 A1 | * | 4/2009 | Blanquart .................. 250/208.1 |

(Continued)

FOREIGN PATENT DOCUMENTS

| | | |
|---|---|---|
| JP | 01-205465 | 8/1989 |
| JP | 2008-277512 | 11/2008 |
| JP | 2009-164598 | 7/2009 |

(Continued)

OTHER PUBLICATIONS

Matsushima, Osamu. "Harnessing solar cell for image sensor design". EE Times-Asia. Mar. 16-31, 2008, eetasia.com.*

(Continued)

*Primary Examiner* — Thao X Le
*Assistant Examiner* — Laura Dykes
(74) *Attorney, Agent, or Firm* — DENTONS US LLP

(57) ABSTRACT

The present disclosure provides a method of manufacturing a solid-state imaging device, including, forming on a first substrate a semiconductor thin film which is to be photoelectric conversion sections, forming driving circuits on a face side of a second substrate, laminating the first substrate and the second substrate by disposing the first substrate and second substrate opposite to each other in a condition in which the semiconductor thin film is connected to the driving circuits, and removing the first substrate from the semiconductor thin film in a condition in which the semiconductor thin film is left on the second substrate side.

15 Claims, 11 Drawing Sheets

(56) References Cited

U.S. PATENT DOCUMENTS

2010/0102368 A1* 4/2010 Matsushima et al. ......... 257/293
2012/0267690 A1* 10/2012 Endo et al. .................... 257/225

FOREIGN PATENT DOCUMENTS

| JP | 2010-182944 | 8/2010 |
| JP | 2010-219339 | 9/2010 |
| WO | 2008/093834 | 8/2008 |

OTHER PUBLICATIONS

Japanese Office Action dated Aug. 19, 2014, issued in connection with counterpart Japanese Patent Application No. 2010-273706.

* cited by examiner

METHOD OF MANUFACTURING SOLID-STATE IMAGING DEVICE, SOLID-STATE IMAGING DEVICE, AND ELECTRONIC APPARATUS

BACKGROUND

The present technology relates to a method of manufacturing a solid-state imaging device in which photoelectric conversion sections are formed through film forming process, a solid-state imaging device obtained by the method, and an electronic apparatus having the solid-state imaging device.

In solid-state imaging devices having a plurality of photoelectric conversion sections arranged in order, there are those of a stacked structure in which photoelectric conversion sections are provided over driving circuits, for attaining an enhanced light reception sensitivity and an enhanced pixel density. As a method of fabricating such a solid-state imaging device, there has been proposed the following lamination method.

First, an impurity is introduced into the face-side surface of a first substrate composed of a silicon substrate, to form light-receiving elements. Next, the first substrate is formed on the back side thereof with trenches reaching the light-receiving elements, and electrodes connected to the light-receiving elements through the trenches are formed on the back side of the first substrate. On the other hand, charge transfer sections and electrodes are formed on one principal surface side of a second substrate. Thereafter, the first substrate and the second substrate are laminated on each other in a condition in which the electrodes formed on the back side of the first substrate are opposed to and connected to the electrodes formed on the one principal surface side of the second substrate. As a result, there is obtained a solid-state imaging device of a stacked structure in which the charge transfer sections formed on the second substrate are provided on the back side of the first substrate provided with the light-receiving elements on the face side (for the foregoing, refer to Japanese Patent Laid-open No. Hei 1-205465).

Besides, in recent years, there has been proposed a solid-state imaging device in which a compound semiconductor is used in place of single crystal silicon. Such a solid-state imaging device has been manufactured by applying a method in which a semiconductor thin film of the compound semiconductor is formed by film forming process. The manufacturing method may, for example, be carried out as follows. First, circuit sections are formed on a semiconductor substrate, and lower electrode layers on a pixel basis are formed in a pattern on the upper side of the circuit sections. Next, a semiconductor thin film is formed on the upper side of the lower electrode layers by sputtering, and the semiconductor thin film is etched on a pixel basis, and transparent electrodes covering the semiconductor thin film are formed. As a result, there is obtained a solid-state imaging device of a stacked structure in which a light-absorbing layer having the semiconductor thin film is provided on the lower electrode layers formed on the circuit sections (for the foregoing, refer to WO 2008/093834).

SUMMARY

In the methods of manufacturing a solid-state imaging device by applying the film forming process of a semiconductor thin film as above-mentioned, however, the semiconductor thin film to be the light-absorbing layer is formed on the upper side of the semiconductor substrate in the state of being formed with the circuit sections and the lower electrode layers. Therefore, a semiconductor thin film high in crystallinity and excellent in photoelectric conversion efficiency is difficult to obtain. Besides, for example in the cases where film forming process at high temperature is conducted or crystallization annealing after film forming process is conducted for the purpose of obtaining a semiconductor thin film with good crystallinity, the circuit sections and the lower electrode layers provided beneath the semiconductor thin film are damaged, for example through melting, under the influence of heating.

Thus, there is a need for a method of manufacturing a solid-state imaging device by which photoelectric conversion sections having a semiconductor thin film excellent in crystallinity can be stackedly formed on the upper side of driving circuits and electrodes without influencing the driving circuits or the electrodes. There is another need for a solid-state imaging device obtained by the manufacturing method, and there is a further need for an electronic apparatus having the solid-state imaging device.

According to an embodiment of the present technology, there is provided a method of manufacturing a solid-state imaging device. In the manufacturing method, first, a semiconductor thin film which is to be photoelectric conversion sections is formed on the face side of a first substrate. On the other hand, driving circuits are formed on the face side of a second substrate. Thereafter, the first substrate and the second substrate are laminated on each other in a condition in which the semiconductor thin film is connected to the driving circuits. Subsequently, the first substrate is removed from the semiconductor thin film in a condition in which the semiconductor thin film is left on the second substrate side.

In such a manufacturing method, the semiconductor thin film is formed on the first substrate which is different from the second substrate provided with the driving circuits. Therefore, film forming process of the semiconductor thin film at a desired process temperature and crystallization annealing at a desired treatment temperature can be performed, to obtain a semiconductor thin film with good crystallinity, without influencing the driving circuits on the second substrate. Then, the semiconductor thin film having good crystallinity is transferred onto the second substrate, which is provided with the driving circuits, by lamination.

According to another embodiment of the present technology, there is provided a solid-state imaging device having a configuration obtained by the just-mentioned manufacturing method. Thus, the solid-state imaging device includes the driving circuits formed in an arrayed state on the face side of a substrate, and photoelectric conversion sections having a semiconductor thin film laminated on the substrate, which is provided with the driving circuits, in the state of being connected to the driving circuits. Particularly, the semiconductor thin film is one that is obtained by film forming process, and the semiconductor thin film is laminated on the substrate provided with the driving circuits.

According to a further embodiment of the present technology, there is provided an electronic apparatus having the solid-state imaging device configured as above-mentioned.

As above-described, according to an embodiment of the present technology, it is possible to obtain a solid-state imaging device of a stacked structure in which photoelectric conversion sections having a semiconductor thin film excellent in crystallinity are stackedly formed on the upper side of driving circuits, without influencing the driving circuits. This makes it possible to obtain a solid-state imaging device excellent in photoelectric conversion efficiency and good in imaging characteristics, and to obtain an electronic apparatus having the solid-state imaging device.

DETAILED DESCRIPTION OF THE PREFERRED EMBODIMENTS

Now, embodiments of the present technology will be described below, based on the drawings. The description will be made in the following order.
1. General configuration example of solid-state imaging device
2. First Embodiment (Example of lamination by connection semiconductor thin film and driving circuit)
3. Second Embodiment (Example of lamination by connection of pixel electrodes on semiconductor thin film and driving circuits)
4. Example of pixel circuit applied to First and Second Embodiment
5. Modification 1 (Example of connection of semiconductor thin film to diffusion layer of second substrate)
6. Modification 2 (Example of connection of pixel electrodes on semiconductor thin film to diffusion layer of second substrate)
7. Example of pixel circuit applied to Modifications 1 and 2
8. Modification 3 (Example in which pixel circuit has global shutter function)
9. Example of pixel circuit applied to Modification 3 (Example in which global shutter function is provided)
10. Third Embodiment (Embodiment of electronic apparatus)

Incidentally, in the embodiments and modifications below, common component elements will be denoted by the same reference symbols, and duplicate descriptions thereof will be omitted.

1. General Configuration Example of Solid-State Imaging Device

Figure 1:
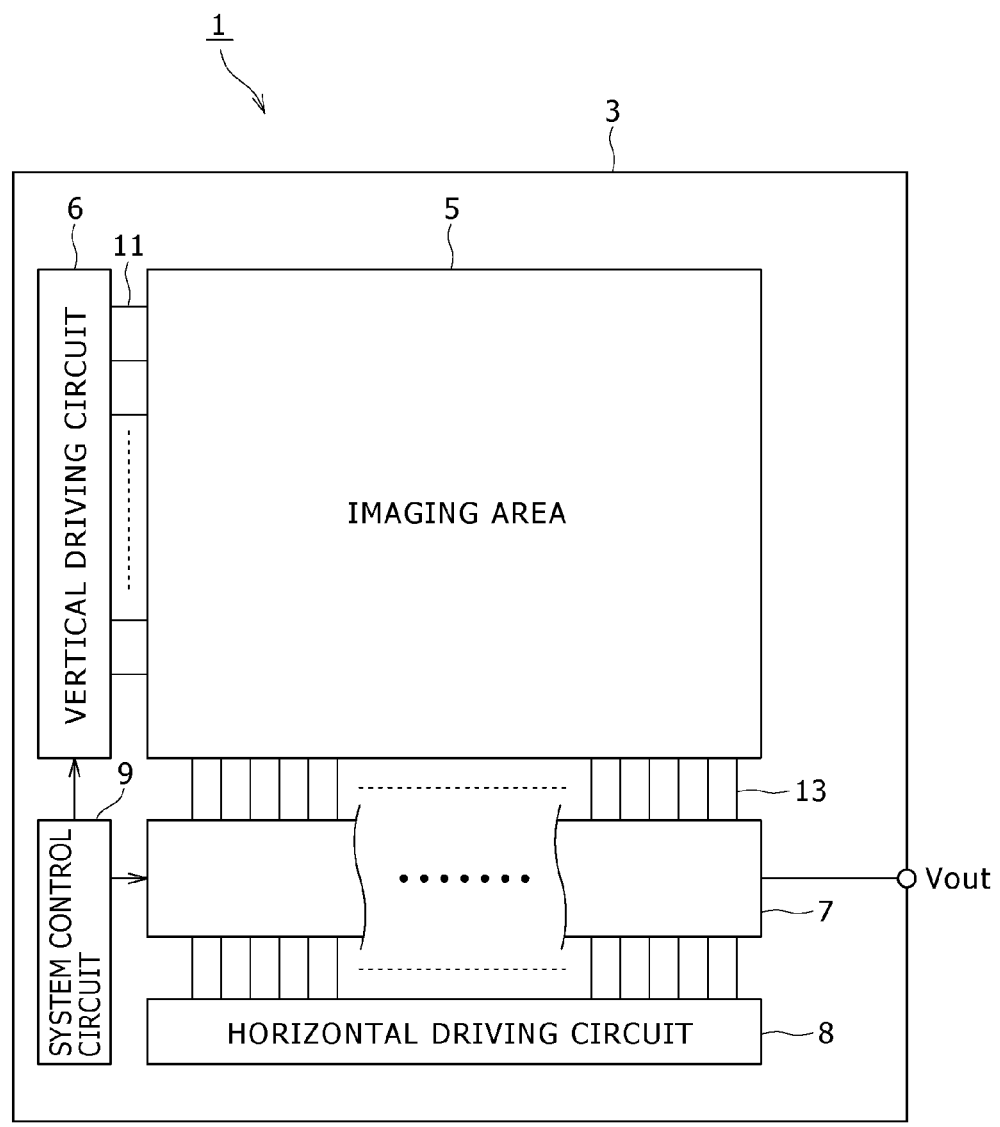
FIG. 1 is a general block diagram of a solid-state imaging device to which the present technology is applied.

FIG. 1 shows general configuration of a MOS (Metal Oxide Semiconductor) type solid-state imaging device as an example of solid-state imaging devices fabricated by application of manufacturing methods according to embodiments of the present technology.

The solid-state imaging device 1 shown in the figure has, on the side of a principal surface of a substrate 3 composed for example of single crystal silicon, an imaging area 5 in which a plurality of pixels each including a photoelectric conversion section are orderly arranged two-dimensionally.

Each of the pixels arrayed in the imaging area 5 is provided with a photoelectric conversion section having a semiconductor thin film (so-called photodiode), and a pixel circuit having a plurality of transistors (so-called MOS transistors), a capacitance element, etc. The configuration of the pixel circuit will be described by exemplifying a configuration suited to each of the embodiments and modifications below. Incidentally, each pixel can have a structure in which a part of one pixel circuit is shared among a plurality of photoelectric conversion sections.

In the periphery of the imaging area 5 as above, there are provided peripheral circuits such as a vertical driving circuit 6, column signal processing circuits 7, a horizontal driving circuit 8, and a system control circuit 9.

The vertical driving circuit 6 is composed, for example, of a shift register, which selects pixel drive lines 11, and supplies the selected pixel drive lines 11 with pulses for driving pixels, to thereby drive the pixels arrayed in the imaging area 5 on a row basis. Specifically, the vertical driving circuit 6 performs selective scan of the pixels (arrayed in the imaging area 5) on a row basis and sequentially in the vertical direction. Besides, pixel signals based on signal charges generated according to the amounts of light received in the pixels are supplied to the column signal processing circuit 7 through vertical signal lines arranged perpendicularly to the pixel drive lines 11.

The column signal processing circuit 7 are arranged on the basis of, for example, each column of the pixels, and applies a signal processing such as noise removal to signals outputted from a one row amount of pixels, on the basis of each pixel column. Specifically, the column signal processing circuits 7 perform CDS (correlated double sampling) for removal of fixed pattern noises peculiar to the pixels, amplification of signals, AD (analog/digital) conversion, and so on.

The horizontal driving circuit 8 is composed, for example, of a shift register, which sequentially outputs horizontal scan pulses, thereby sequentially selecting the column signal processing circuits 7, and causes pixel signals to be outputted from the column signal processing circuits 7.

The system control circuit 9 receives an input clock and data for instructing an operating mode or the like, and outputs such data as internal information of the solid-state imaging device 1. Specifically, the system control circuit 9 produces control signals as well as a clock signal to be used as a reference for operations of the vertical driving circuit 6, the column signal processing circuits 7, the horizontal driving circuit 8 and the like, based on a vertical synchronizing signal, a horizontal synchronizing signal and a master clock. Then, these signals are inputted to the vertical driving circuit 6, the column signal processing circuits, the horizontal driving circuit 8 and the like.

The above-mentioned peripheral circuits 6 to 9 and the pixel circuits provided in the imaging area 5 constitute driving circuits for driving the pixels.

2. First Embodiment

Method of Manufacturing Solid-State Imaging Device

FIGS. 2A to 2G are sectional step diagrams for illustrating the method of manufacturing the solid-state imaging device according to the first embodiment of the present technology, each figure showing a section corresponding to three of the pixels arrayed in the imaging area 5 as described using FIG. 1 above. Based on FIGS. 2A to 2G, the method of manufacturing the solid-state imaging device according to the first embodiment will be described below.

Figure 2A:
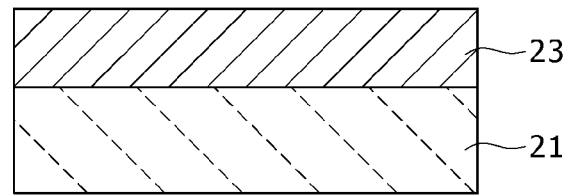
FIGS. 2A to 2D are sectional step diagrams (part 1) for illustrating a method of manufacturing a solid-state imaging device according to a first embodiment of the present technology.

Fist, as shown in FIG. 2A, a first substrate 21 is prepared. The first substrate 21 is a substrate formed from a single crystal material, for example, single crystal silicon (Si), single crystal gallium-arsenic (GaAs), single crystal indium-phosphorus (InP) or the like.

A semiconductor thin film 23 to be photoelectric conversion sections is formed over the first substrate 21. Here, on the first substrate 21 formed of the single crystal material, the semiconductor thin film 23 is grown epitaxially in relation to the first substrate 21, whereby the semiconductor thin film 23 having a crystalline structure is preliminarily formed.

Examples of the material of the semiconductor thin film 23 formed by epitaxial growth include GaInP, AlInP, GaInAs, AlInAs, and, further, those compound semiconductor materials which has the chalcopyrite structure. The semiconductor materials of the chalcopyrite structure are materials with which a high light absorption coefficient and a high sensitivity over a wide wavelength range can be obtained, and which can be preferably used for forming the semiconductor thin film 23 for photoelectric conversion. The semiconductor materials of the chalcopyrite structure are configured by use of elements in the surroundings of the Group IV elements in the Periodic Table, namely, by use of such elements as Cu, Al, Ga, In, S, and Se. Examples of such semiconductor materials include CuGaInS mixed crystal, CuAlGaInS mixed crystal, and CuAlGaInSSe mixed crystal. For the semiconductor thin films 23, a material which does not undergo mismatch of lattice constant in relation to the first substrate 21 serving as a substrate for film forming process and with which a band gap enabling photoelectric conversion over a desired wavelength range is obtained is selected with an appropriate composition.

In addition, the epitaxial growth of the semiconductor thin film 23 is carried out by a CVD (Chemical Vapor Deposition) method or an MBE (Molecular Beam Epitaxy) method in which a film forming gas containing the elements for constituting the semiconductor thin film 23 is used. In this epitaxial growth, the substrate temperature influences the crystalline state of the semiconductor thin film 23 formed. Therefore, it is important to set the substrate temperature at the time of film forming process, for each material used to form the semiconductor thin film 23.

Examples of combinations (1) to (3) of the material constituting the first substrate 21 with the material constituting the semiconductor thin film 23 as well as examples of the substrate temperature (at the time of film forming process) suitable for each material constituting the semiconductor thin film 23 are set forth below.

(1) Where GaAs Substrate is Used as First Substrate 21
$(Ga_{0.52}In_{0.48})P$: 500 to 600° C.
$(Al_{0.53}In_{0.47})P$: about 650° C.
(2) Where InP Substrate is Used as First Substrate 21
$(Ga_{0.47}In_{0.53})As$: 450 to 600° C.
$(Al_{0.47}In_{0.53})As$: about 600° C.
(3) Where Si Substrate is Used as First Substrate 21
$Cu(Ga_{0.52}In_{0.48})S_2$: 400 to 600° C.
$Cu(Al_{0.24}Ga_{0.23}In_{0.53})S_2$: 400 to 600° C.
$Cu(Al_{0.36}Ga_{0.64})(S_{1.28}Se_{0.72})$: 400 to 600° C.

Incidentally, the semiconductor thin film 23 as above may be formed by a process in which a film of a material free of possibility of mismatch of lattice constant in relation to the first substrate 21 serving as a substrate for film forming process is formed with an appropriate composition in the beginning period and, thereafter, the composition is gradually varied so that a desired band gap is obtained. Further, an annealing treatment for enhancing crystallinity may be performed, if desirable. In addition, such a semiconductor thin film 23 is formed to be of P-type, I-type, or N-type. In the case where the semiconductor thin film 23 is formed to be of I-type, P-type or N-type conductivity is imparted to the semiconductor thin film 23 by impurity introduction such as ion implantation.

Figure 2B:
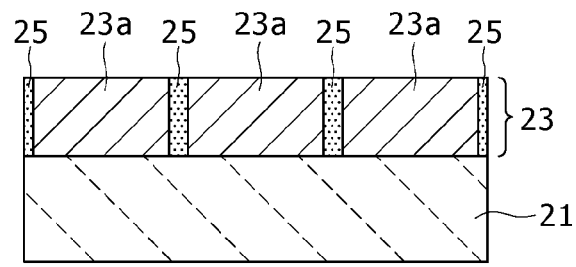

Next, as shown in FIG. 2B, the semiconductor thin film 23 is formed therein with isolation regions 25 so as to isolate the semiconductor thin film 23 on a pixel basis, thereby forming photoelectric conversion sections 23a. Here, for example, a mask pattern is formed on the semiconductor thin film 23 by a lithographic method, and ion implantation from above the mask pattern and the subsequent annealing treatment are conducted, to form impurity layers penetrating the semiconductor thin film 23 in the depth direction, as isolation regions 25. In this instance, where the semiconductor thin film 23 is of P-type, an N-type impurity is introduced by ion implantation, and where the semiconductor thin film 23 is of N-type, a P-type impurity is introduced by ion implantation. After the ion implantation, removal of the mask pattern is conducted. Incidentally, the isolation regions 25 may be formed by filling up trenches with an insulating film. In this case, STI (Shallow Trench Isolation) regions are formed independently of the conduction type of the semiconductor thin film 23.

Figure 2C:
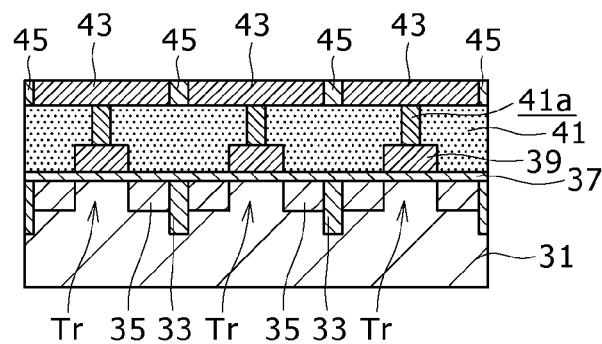

On the other hand, as shown in FIG. 2C, a second substrate 31 is prepared. As the second substrate 31, there is preferably used a substrate for which an appropriate process has been established, for example, a single crystal silicon substrate. On the face side of such a second substrate 31, there are formed pixel circuits each including a transistor Tr, a capacitance element (omitted in the drawing here) and, further, wiring for connection of these elements, and driving circuits including the pixel circuits.

In this case, first, for example, isolation regions 33 are formed in a surface layer of the second substrate 31 to isolate the semiconductor substrate 31 on a pixel basis on the face side. In each of the pixel regions thus isolated by the isolation regions 33, there are formed diffusion layers which will be source/drain regions 35 and a lower electrode of the capacitance element, respectively. Here, where the semiconductor thin film 23 formed on the first substrate 21 as above-mentioned is of N-type, the isolation regions 33 are formed to be of P-type, whereas the source/drain regions 35 are formed to be of N-type, and the region between the source/drain regions 35 is set to be of low-concentration P-type. On the other hand, where the semiconductor thin film 23 formed on the first substrate 21 as above-mentioned is of P-type, the isolation regions 33 are formed to be of N-type, whereas the source/ drain regions 35 are formed to be of P-type, and the region between the source/drain regions 35 is set to be of low-concentration N-type.

Furthermore, the face side of the second substrate 31 is covered with a gate insulating film 37, on which an electrode layer is formed for constituting gate electrodes 39, upper electrodes of the capacitance elements and, further, wirings for connection of them. As a result, the transistors Tr and the capacitance elements (omitted in the drawing here) are formed on the face side of the second substrate 31. Incidentally, the electrode layer including the gate electrodes 39 is formed by use of polysilicon or a metallic material having good conductivity such as aluminum, tungsten or molybdenum.

Thereafter, an inter-layer dielectric film 41 having a flat surface is formed over the second substrate 31, and the inter-layer dielectric film 41 is formed therein with contact holes 41a in necessary portions thereof. Here, the contact holes 41a are formed to reach the gate electrodes 39 of the transistors Tr.

Next, pixel electrodes 43 connected to the gate electrodes 39 through the contact holes 41a are formed in a patterned manner on the inter-layer dielectric film 41. The pixel electrodes 43 are patterned in shapes in 1:1 correspondence with the photoelectric conversion sections 23a having the semiconductor thin film 23 formed on the first substrate 21. The pixel electrodes 43 are preferably patterned in substantially the same shapes as the plan-view shapes of the photoelectric conversion sections 23a. Such pixel electrodes 43 are formed by use of a metallic material having good conductivity, such as aluminum, tungsten or molybdenum.

Thereafter, insulation films 45 are formed in the state of filling up the gaps (spaces) between the pixel electrodes 43, if desirable. By the foregoing steps, pixel circuits each including the transistor Tr, the capacitance element, the wiring and the pixel electrode 43 are formed respectively in the pixel regions on the face side of the second substrate 31. While the circuit configuration of the pixel circuit will be described using a circuit diagram later, an amplification transistor is shown in the drawing here. In addition, on the face side of the second substrate 31 and specifically on the outside of the imaging area provided with the pixel electrodes 43 in an arrayed state, peripheral circuits which include transistors Tr, capacitances, and wirings having the same layer as that of the pixel electrodes 43 are formed by the same steps as above-mentioned. The pixel circuits and the peripheral circuits together constitute driving circuits.

Incidentally, it suffices for the above-mentioned steps carried out to form the driving circuits on the face side of the second substrate 31 to be carried out according to an ordinary semiconductor process, and the order of the steps is not restricted. Further, the gate electrodes 39 and the pixel electrodes 43 and the like may be formed by application of the so-called damascene process; in this case, the gate electrodes 39 and the pixel electrodes 43 can be formed by use of a metallic material unsuited to etching, such as copper (Cu).

Figure 2D:
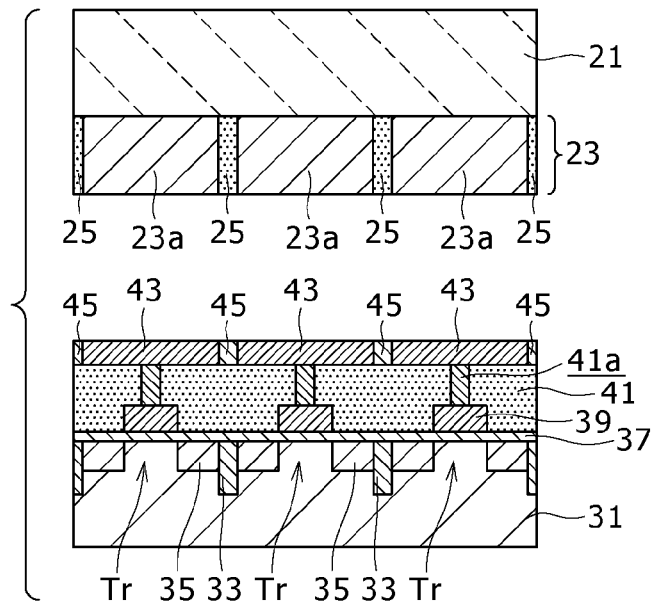

Subsequently, as shown in FIG. 2D, the first substrate 21 and the second substrate 31 are disposed opposite to each other by aligning them so that the photoelectric conversion sections 23a of the first substrate 21 and the pixel electrodes 43 of the second substrate 31 face each other and are in 1:1 correspondence with each other.

Figure 2E:
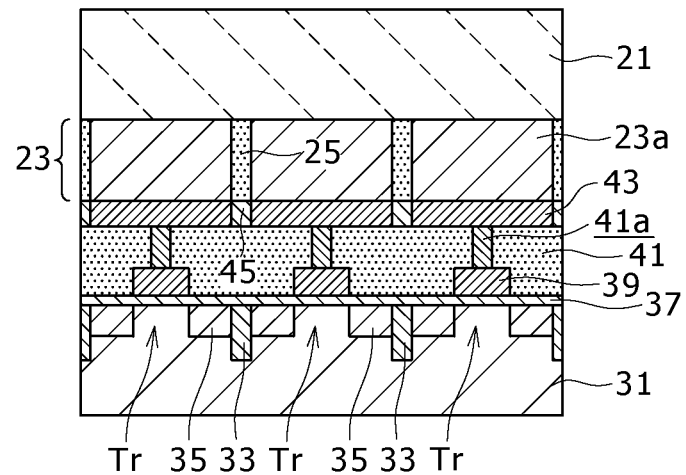
FIGS. 2E to 2G are sectional step diagrams (part 2) for illustrating the manufacturing method according to the first embodiment.

In this condition, as shown in FIG. 2E, the first substrate 21 and the second substrate 31 are laminated on each other so that the photoelectric conversion sections 23a and the pixel electrodes 43 are bonded to each other. Here, the photoelectric conversion sections 23a and the pixel electrodes 43 are bonded directly to each other by a known method, such as a surface activation bonding method and a warming and pressing method. Besides, in this instance, the first substrate 21 and the second substrate 31 are laminated in a condition where the semiconductor thin films 23 constituting the photoelectric conversion sections 23a are connected, in a wide state, to the pixel electrodes 43 constituting the driving circuits (pixel circuits). This ensures that electric charges obtained by photoelectric conversion in the photoelectric conversion sections 23a can be extracted efficiently through the pixel electrodes 23. Therefore, it is important in the lamination step that the first substrate 21 and the second substrate 31 are laminated on each other while keeping the aligned state so that the photoelectric conversion sections 23a and the pixel electrodes 43 would not come out of registration.

Figure 2F:
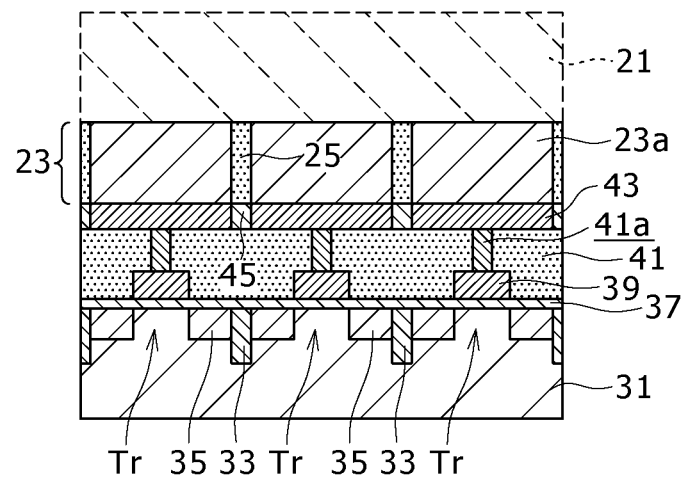

Next, as shown in FIG. 2F, the first substrate 21 is removed from the semiconductor thin film 23 in a condition in which the semiconductor thin film 23 formed with the photoelectric conversion sections 23a is left on the second substrate 31 side. In this instance, the first substrate 21 is subjected to polishing or wet etching. This results in that the photoelectric conversion sections 23a are exposed on the upper side of the second substrate 31.

Figure 2G:
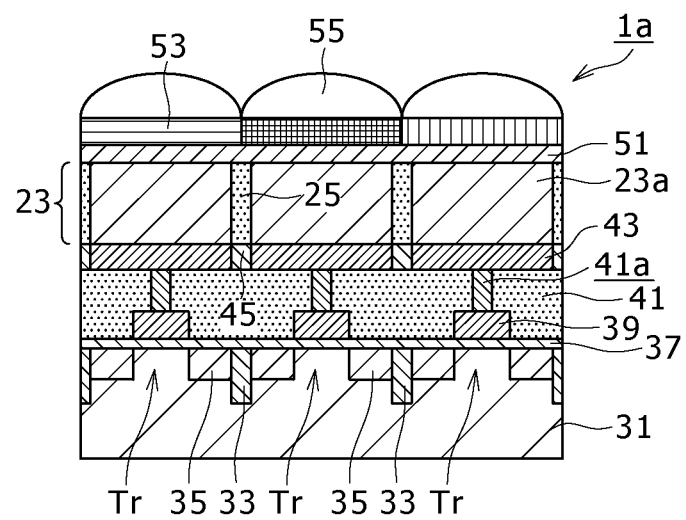

After the above-mentioned steps, as shown in FIG. 2G, a protective film 51 is formed over the semiconductor thin film 23 constituting the photoelectric conversion sections 23a. As the protective film 51, a film of a material having passivation properties is used, or, alternatively, a film of a material having a fixed charge for compensating for a defect level in the surface of the semiconductor thin film 23 is used.

Examples of the film of the material having passivation properties include a silicon oxide film, a silicon nitride film, and a silicon oxynitride film which are ordinarily used.

On the other hand, as the film of the material having a fixed charge, for example, a film of a material having a negative fixed charge is formed in the case where the semiconductor thin film 23 is of N-type, and a film of a material having a positive fixed charge is formed in the case where the semiconductor thin film 23 is of P-type.

Examples of the film of the material having a negative fixed charge include metallic oxide films and silicon material films. In the case of the metallic oxide film, a material which itself has a negative fixed charge, for example, a transition metal oxide film, is preferably used. Specific and preferable examples of such a metallic oxide include hafnium oxide ($HfO_2$), zirconium oxide ($ZrO_2$), aluminum oxide ($Al_2O_3$), titanium oxide ($TiO_2$), and tantalum oxide ($Ta_2O_5$). In the case of the silicon material film, a material which itself has a negative fixed charge is preferred, and a silicon oxide film containing an impurity such as boron or phosphorus is preferably used. Specific examples of such a material include boron-containing silicon oxide (BSG), phosphorus-containing silicon oxide (PSG), and a boron- and phosphorus-containing silicon oxide (BPSG).

The film of the material having a negative fixed charge as above-mentioned is preferably formed as a carbon-containing film by carrying out film forming process using an organometallic or organosilane gas, whereby the negative fixed charge in the film can be further increased (see Japanese Patent Laid-open No. 2010-67736).

Other than the above, for example, a transparent electrode material film is used as the film of the material having a negative fixed charge. In the case where the semiconductor thin film 23 is of P-type, a negative voltage may be impressed on the protective film 51 having the transparent electrode material film, whereby the protective film 51 can be used as a film having a negative fixed charge.

In addition, for example, a transparent electrode material film is used as the film of the material having a positive fixed charge. In the case where the semiconductor thin film 23 is of N-type, a positive electrode may be impressed on the protective film 5 having the transparent electrode material film, whereby the protective film 51 can be used as a film having a positive fixed charge.

Incidentally, the above-mentioned protective film 51 may have a monolayer structure or a stacked structure. In the case of the stacked structure, there may be formed a stacked structure in which a film of a material having passivation properties is stacked on top of a film of a material having a fixed charge.

Next, a color filter layer 53 having color filters formed in a pattern corresponding to the photoelectric conversion sections 23a is formed over the protective film 51, and, further, on-chip lenses 55 are formed. In the foregoing steps, a solid-state imaging device 1a is obtained.

<Configuration of Solid-State Imaging Device>

The solid-state imaging device 1a obtained as above has, on the face side of the second substrate 31, the driving circuits including the pixel circuits each having the transistor Tr and the pixel electrode 43. This second substrate 31 corresponds to the substrate 3 shown in FIG. 1. In addition, the semiconductor thin film 23 is provided on the second substrate 23 in the state of being connected to the pixel electrodes 43 constituting the pixel circuits. In the present embodiment, the semiconductor thin film 23 is a film formed by film forming process on the first substrate 21 different from the second substrate 31, and is transferred by lamination to the side of the second substrate 31 provided with the driving circuits including the pixel circuits. The semiconductor thin film 23 is provided therein with a plurality of the photoelectric conversion sections 23a by the isolation regions 25, and each of the photoelectric conversion sections 23a and each of the pixel electrodes 43 are bonded to each other in 1:1 correspondence.

Besides, the color filter layer 53 and the on-chip lenses 55 are provided in this order on the upper side of the semiconductor thin film 23, through the protective film 51 having passivation properties or having a fixed charge.

Operation and Effect of the First Embodiment

In the first embodiment as above-described, the semiconductor thin film 23 is formed on the first substrate 21 other than the second substrate 31 provided with the driving circuits including the pixel circuits. Therefore, any of various semiconductor thin films 23 having good crystallinity can be obtained by film formation through epitaxial growth at a desired high temperature and crystallization annealing at a desired high temperature, without affecting the driving circuits formed by use of metallic materials on the second substrate 31. Then, the semiconductor thin film 23 is transferred by lamination onto the semiconductor substrate 31 provided with the driving circuits, whereby the photoelectric conversion sections 23a having the semiconductor thin film 23 can be stacked on the upper side of the driving circuits.

As a result, it is possible to obtain a solid-state imaging device in which photoelectric conversion sections having a semiconductor thin film excellent in crystallinity is stacked on the upper side of driving circuits high in reliability. As a result, a semiconductor thin film 23 of the chalcopyrite structure capable of obtaining a high light absorption coefficient and a high sensitivity over a wide wavelength range, for example, can be formed with good crystallinity, to be used as photoelectric conversion sections 23a. Besides, it is possible to obtain a solid-state imaging device having an excellent photoelectric conversion efficiency and good imaging characteristics, and to obtain an electronic apparatus having the solid-state imaging device.

3. Second Embodiment

Method of Manufacturing Solid-State Imaging Device

FIGS. 3A to 3F are sectional step diagrams for illustrating a method of manufacturing a solid-state imaging device according to a second embodiment of the present technology. Now, the method of manufacturing the solid-state imaging device according to the second embodiment will be described below, based on the drawings.

Figure 3A:
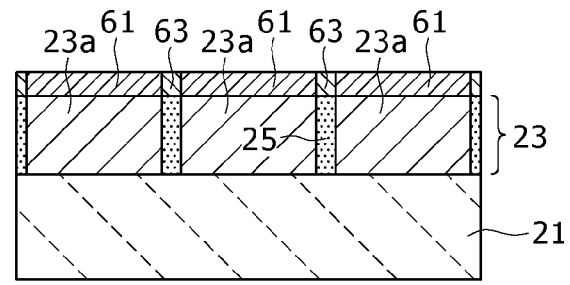
FIGS. 3A to 3C are sectional step diagrams (part 1) for illustrating a method of manufacturing a solid-state imaging device according to a second embodiment of the present technology.

First, as shown in FIG. 3A, a semiconductor thin film 23 is formed by epitaxial growth on a first substrate 21 formed from a single crystal material, and isolation regions 25 are formed to isolate the semiconductor thin film 23 into photoelectric conversion sections 23a. Up to this point, the steps are conducted in the same manner as described using FIGS. 2A and 2B in the first embodiment above. In this instance, like in the first embodiment, it is particularly important to appropriately set the substrate heating temperature at the time of film forming process and thereby to obtain a semiconductor thin film 23 with good crystallinity, in forming the semiconductor thin film 23 by epitaxial growth.

After the above-mentioned steps, in the second embodiment, pixel electrodes 61 are formed in a patterned state on the isolated photoelectric conversion sections 23a. The pixel electrodes are formed by use of a metallic material having good conductivity, such as aluminum, tungsten or molybdenum. The pixel electrodes 61 are formed by film forming process of the metallic material film and patterning of the metallic material film.

The pixel electrodes 61 are each preferably formed in the state of being patterned in such a shape as to widely cover the photoelectric conversion device 23a; more preferably, the pixel electrodes 61 are each formed in a pattern shape such as to cover the whole surface of the photoelectric conversion section 23a. This ensures that the electric charges obtained by photoelectric conversion in the photoelectric conversion sections 23a can be efficiently extracted through the pixel electrodes 61. In addition, the gaps (spaces) between the pixel electrodes 61 are filled up with an insulating film 63, thereby isolating the pixel electrodes 61 and 61 from each other. Incidentally, the pixel electrodes 61 may have a buried wiring structure. In this case, the insulating film 63 is formed, the insulating film 63 is formed with trench patterns, and the trench patterns are filled up with a metallic material, to form the pixel electrodes 61.

Figure 3B:
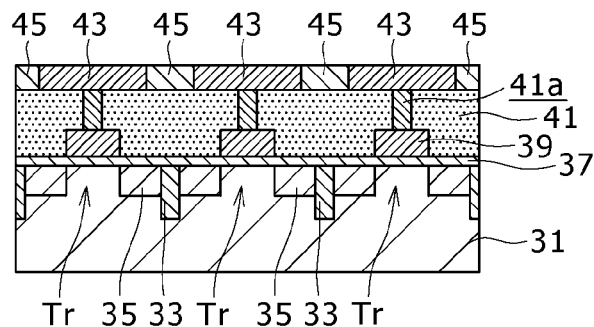

The step shown in FIG. 3B is carried out in the same manner as described using FIG. 2C in the first embodiment above, whereby driving circuits having transistors Tr and other elements interconnected by wiring are formed on the face side of the second substrate 31. A part of the driving circuit is a pixel circuit which is disposed in the imaging area, and has a pixel electrode 43 patterned on a pixel basis. Each of the pixel electrodes 43 is patterned in a shape for 1:1 correspondence with each of the photoelectric conversion device 23a formed on the first substrate 21. This is the same as in the first embodiment above. It is to be noted here, however, that each pixel electrode 43 formed in this second embodiment may not necessarily be patterned in substantially the same shape as the plan-view shape of the photoelectric conversion section 23a, but may have a somewhat smaller plan-view shape as compared with the photoelectric conversion section 23a.

Figure 3C:
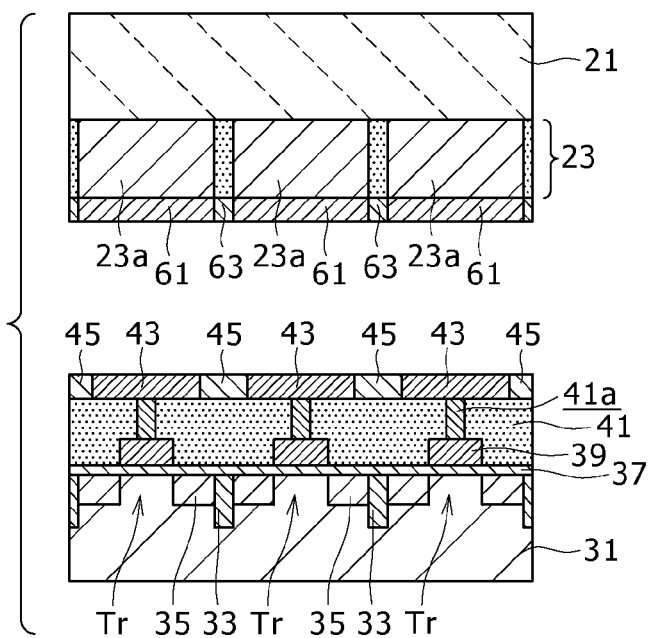

Next, as shown in FIG. 3C, the first substrate 21 and the second substrate 31 are disposed opposite to each other by aligning them so that the pixel electrodes 61 of the first substrate 21 and the pixel electrodes 43 of the second substrate 31 face each other and are in 1:1 correspondence with each other.

Figure 3D:
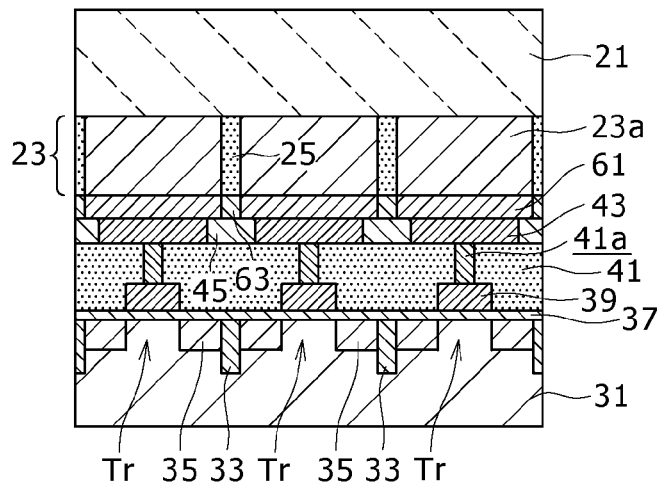
FIGS. 3D to 3F are sectional step diagrams (part 2) for illustrating the manufacturing method according to the second embodiment.

In this condition, as shown in FIG. 3D, the first substrate 21 and the second substrate 31 are laminated on each other so that the pixel electrodes 61 and the pixel electrodes 43 are mutually bonded. In this instance, the pixel electrodes 61 and the pixel electrodes 43 are bonded directly to each other by a known method such as a surface activation bonding method and a warming and pressing method. As a result, the first substrate 21 and the second substrate 31 are laminated on each other in a condition in which the semiconductor thin film constituting the photoelectric conversion sections 23a is connected, through the pixel electrodes 61, to the pixel electrodes 43 constituting the driving circuits. Incidentally, it is important in this step that the first substrate 21 and the second substrate 31 are laminated on each other while keeping them in the aligned state so that the pixel electrodes 61 and the pixel electrodes 43 are in 1:1 correspondence and would not come out of registration.

The subsequent procedure is carried out in the same manner as in the first embodiment above.

Figure 3E:
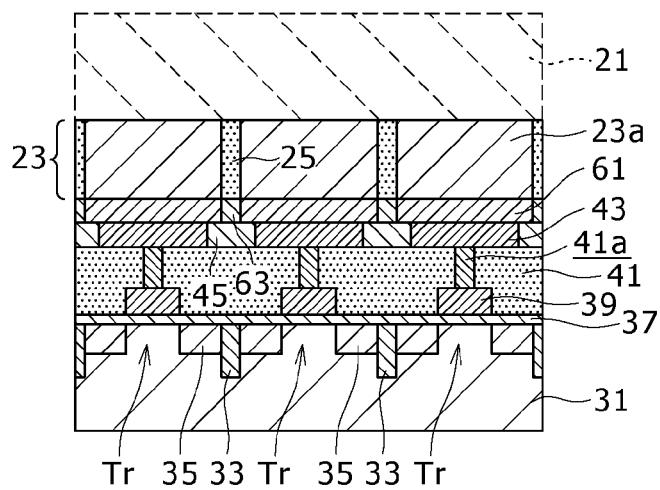

Specifically, first, as shown in FIG. 3E, the first substrate 21 is removed from the semiconductor thin film 23 in a condition in which the semiconductor thin film 23 formed with the photoelectric conversion sections 23a is left on the second substrate 31 side, and the photoelectric conversion sections 23a are exposed on the upper side of the second substrate 31.

Figure 3F:
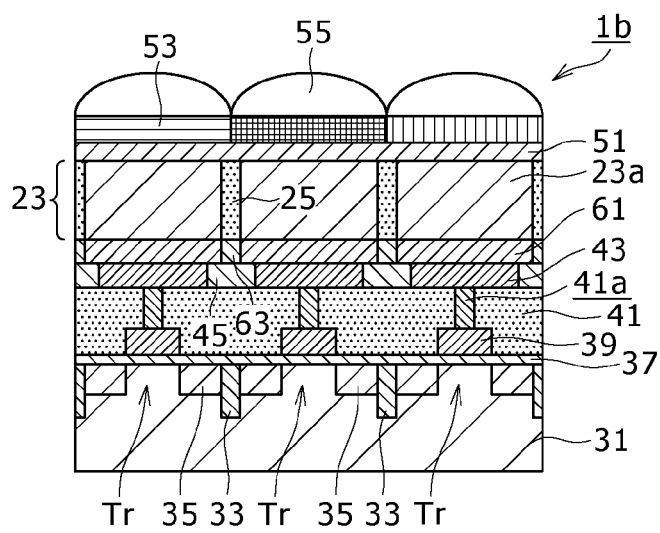

Thereafter, as shown in FIG. 3F, a protective film 51 having a film of a material which has at least one of passivation property and a fixed charge for compensating for a defect level in the surface of the semiconductor thin film 23 is formed over the semiconductor thin film 23 constituting the photoelectric conversion sections 23a. Next, over the protective film 51, a color filter layer 53 having color filters formed in a pattern is formed, correspondingly to the photoelectric conversion sections 23a, and, further, on-chip lenses 55 are formed. By the above-mentioned steps, a solid-state imaging device 1b is obtained.

<Configuration of Solid-State Imaging Device>

The solid-state imaging device 1b thus obtained is the same as the solid-state imaging device 1a of the first embodiment, except that the pixel electrodes 43, 61 have the stacked structure.

Specifically, in the configuration adopted in this second embodiment, the pixel electrodes 61 are further stacked on the pixel electrodes 43 provided on the second substrate 31 side, and the photoelectric conversion sections 23a are provided on the upper side of the pixel electrodes 61. Of the two kinds of pixel electrodes, the pixel electrodes 43 provided on the second substrate side 31 are required only to be provided in 1:1 correspondence with the photoelectric conversion sections 23a, and may be smaller in plan-view shape than the photoelectric conversion sections 23a. On the other hand, the pixel electrodes 61 provided on the side of the photoelectric conversion sections 23a are provided in 1:1 correspondence with the photoelectric conversion sections 23a and are substantially the same as the photoelectric conversion sections 23a in plan-view shape.

Operation and Effect of Second Embodiment

Even in the second embodiment as above-described, the semiconductor thin film 23 is formed on the first substrate 21 other than the second substrate 31 provided with the driving circuits including the pixel circuits. Therefore, like in the first embodiment above, various semiconductor thin films with good crystallinity can be obtained by performing epitaxial growth at a desired high temperature and crystallization annealing at a desired high temperature, without influencing the driving circuits on the second substrate 31. Besides, onto the second substrate 31 provided with the driving circuits, the semiconductor thin film 23 with good crystallinity can be transferred through lamination.

As a result, a solid-state imaging device can be obtained in which photoelectric conversion sections having a semiconductor thin film excellent in crystallinity are stacked on the upper side of the driving circuits having good reliability. As a result, a semiconductor thin film 23 of the chalcopyrite structure capable of obtaining a high light absorption coefficient and a high sensitivity over a wide wavelength range, for example, can be formed with good crystallinity, to be used as photoelectric conversion sections 23a. Besides, it is possible to obtain a solid-state imaging device having an excellent photoelectric conversion efficiency and good imaging characteristics, and to obtain an electronic apparatus having the solid-state imaging device.

In addition, particularly, in this second embodiment, the pixel electrodes 61 are formed on the photoelectric conversion sections 23a isolated from each other on the first substrate 21, prior to lamination of the first substrate 21 and the second substrate 31. Therefore, the pixel electrodes 61 widely covering the photoelectric conversion sections 23a can be provided without being influenced by the positional accuracy in lamination. This makes it possible to securely form the solid-state imaging device 1b in which electric charges can be efficiently extracted from the photoelectric conversion sections 23a through the pixel electrodes 61.

4. Example of Pixel Circuit to be Applied to the First and Second Embodiments

Figure 4:
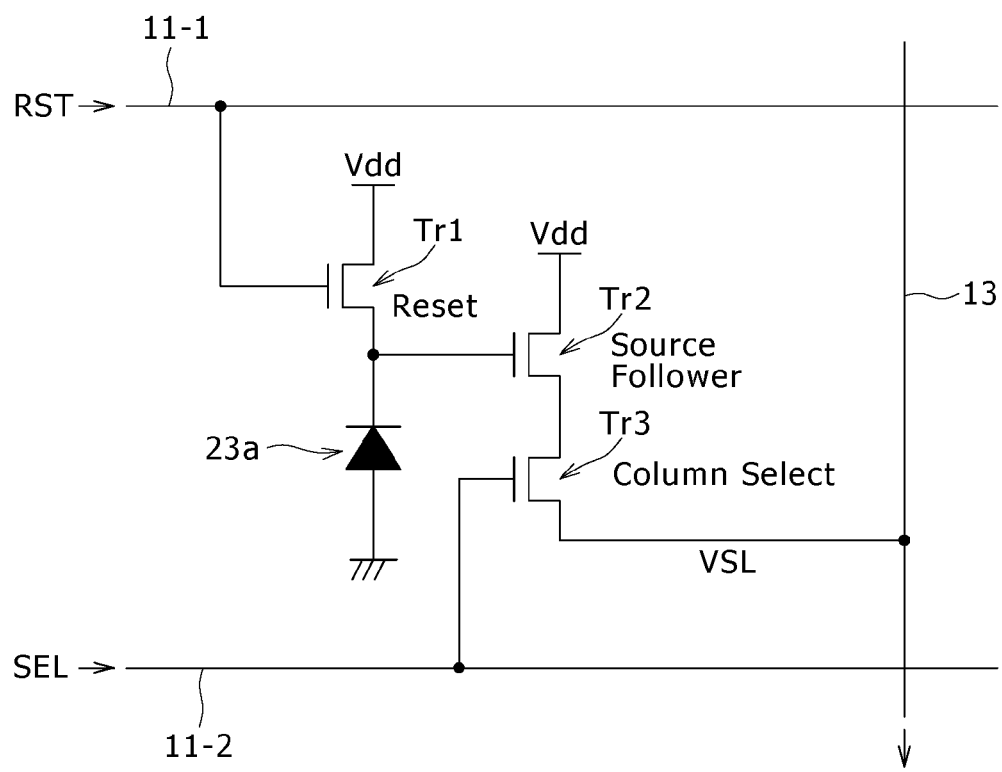
FIG. 4 is a diagram showing an example of a driving circuit provided in the solid-state imaging device according to any of the first and second embodiments.

FIG. 4 is a major part circuit diagram illustrating an example of a pixel circuit provided in any of the solid-state imaging device 1a of the first embodiment and the solid-state imaging device 1b of the second embodiment. Incidentally, the pixel circuit is a circuit disposed in the imaging area, and is a circuit which constitutes a part of the driving circuit provided in the solid-state imaging device 1a, 1b.

As shown in the circuit diagram, each photoelectric conversion section 23a has three transistors Tr1 through Tr3 which are interconnected. These transistors are a reset transistor Tr1, an amplification transistor Tr2, and a selection transistor Tr3. Of these transistors, the amplification transistor Tr2 corresponds to the transistor (Tr) shown in the sectional views in the first and second embodiments above. The photoelectric conversion section 23a is connected to a gate electrode of the amplification transistor Tr2 through the pixel electrode.

The reset transistor Tr1 has the gate electrode thereof connected to a reset line 11-1 (which is one of the pixel drive lines 11), has one of source/drain regions thereof connected to the photoelectric conversion section 23a, and has the other of the source/drain regions thereof connected to a power source voltage Vdd. The amplification transistor Tr2 has a gate electrode thereof connected to a point between the photoelectric conversion section 23a and the reset transistor Tr1, has one of source/drain regions thereof connected to the power source voltage Vdd, and has the other of the source/drain regions thereof connected to a source/drain region of the selection transistor Tr3. The selection transistor Tr3 has a gate electrode thereof connected to a selection line 11-2 (which is one of the pixel drive lines 11), has one of source/drain regions thereof connected to the amplification transistor Tr2, and has the other of the source/drain regions thereof connected to the vertical signal line 13.

In the pixel circuit as above, a signal charge in the photoelectric conversion section 23*a* is reset by application of a reset signal RST from the reset line 11-1. Thereafter, application of a selection signal SEL from the selection line 11-2 results in that signal charges from the photoelectric conversion sections 23*a* of the pixels which share the same selection line 11-2 are sequentially read out to the vertical signal line 13.

5. Modification 1

Figure 5:
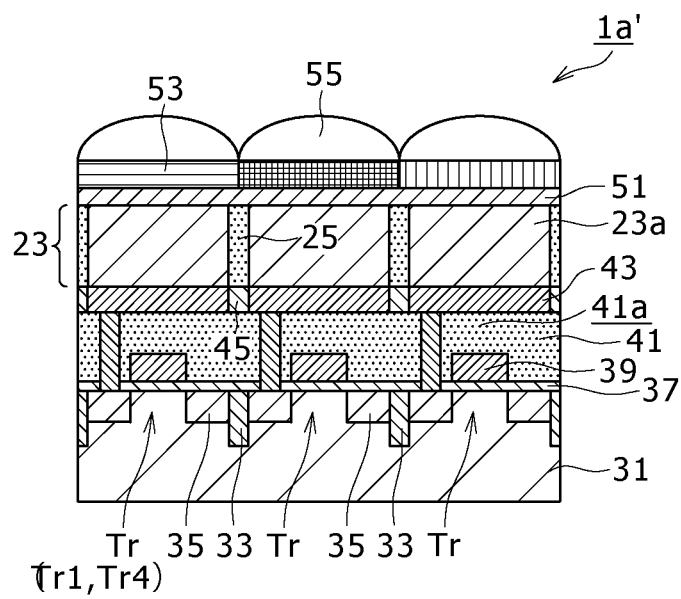
FIG. 5 is a major part sectional view showing the configuration of modification 1 of the embodiment of the present technology.

FIG. 5 is a major part sectional view for illustrating the configuration of a solid-state imaging device 1*a*' as a modification of the first embodiment. The solid-state imaging device 1*a*' shown in this figure is the same in configuration as that in the first embodiment above, except that pixel electrodes 43 bonded to photoelectric conversion sections 23*a* are each connected to a source/drain region 35 of a transistor Tr constituting a pixel circuit.

The solid-state imaging device 1*a*' configured as above can be manufactured in the same manner as in the first embodiment above, except that the layout of elements and wiring are changed, in the driving circuit forming step described using FIG. 2C in the first embodiment. Therefore, effects equivalent or similar to those of the first embodiment can be obtained.

6. Modification 2

Figure 6:
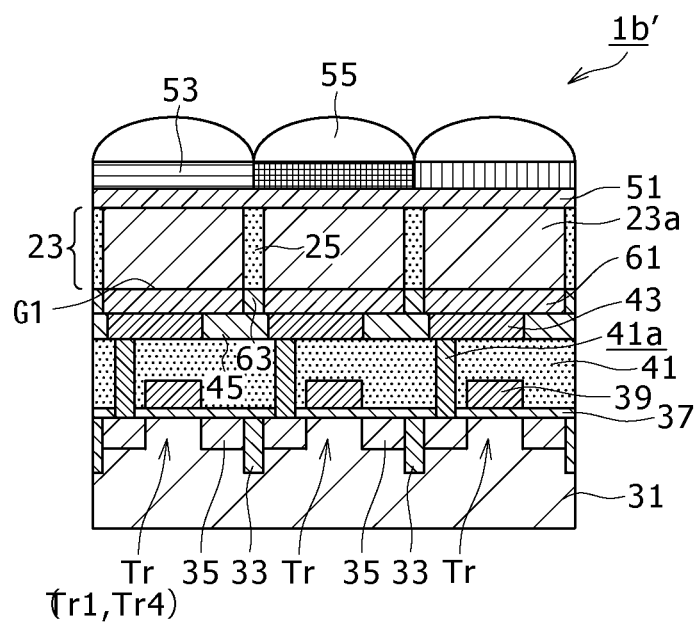
FIG. 6 is a major part sectional view showing the configuration of modification 2 of the embodiment of the present technology.

FIG. 6 is a major part sectional view for illustrating the configuration of a solid-state imaging device 1*b*' as a modification of the second embodiment. The solid-state imaging device 1*b*' shown in this figure is the same in configuration as that in the second embodiment above, except that a pixel electrode 43, 61 bonded to a photoelectric conversion section 23*a* is connected to a source/drain region 35 of a transistor Tr constituting a pixel circuit.

The solid-state imaging device 1*b*' configured as above can be manufactured in the same manner as in the second embodiment above, except that the layout of elements and wiring are changed, in the driving circuit forming step described using FIG. 3B in the second embodiment. Accordingly, effects equivalent or similar to those of the second embodiment can be obtained.

7. Example of Pixel Circuit Applied to Modifications 1 and 2

Figure 7:
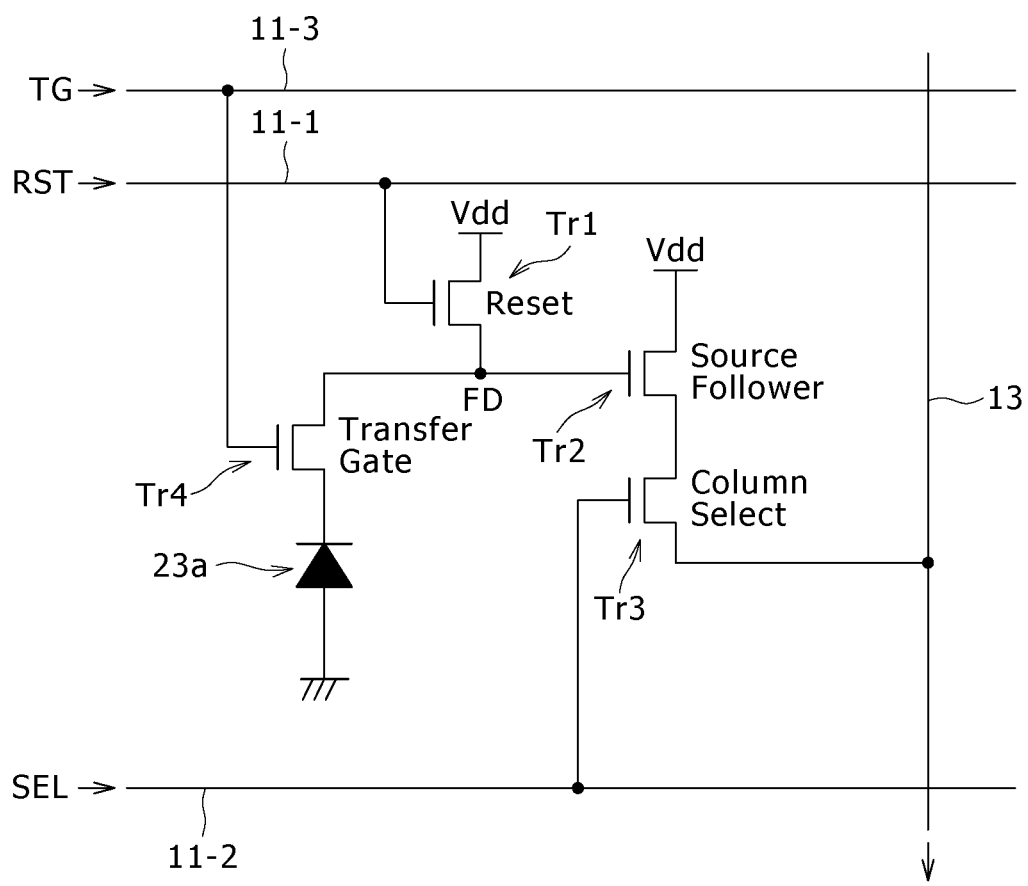
FIG. 7 is a diagram showing an example of a driving circuit provided in the solid-state imaging device according to any of modification examples 1 and 2.

FIG. 7 is a major part circuit diagram showing an example of a pixel circuit provided in any of the solid-state state imaging device 1*a*' of Modification 1 and the solid-state imaging device 1*b*' of Modification 2. Incidentally, the pixel circuit is a circuit disposed in an imaging area, and is a circuit constituting a part of a driving circuit provided in the solid-state imaging device 1*a*', 1*b*'.

The pixel circuit shown in FIG. 7 differs from the pixel circuit described using FIG. 4 above in that four transistors Tr1 through Tr4 including a transfer transistor Tr4 newly added to the above-mentioned three transistors Tr1 through Tr3 are provided. Of the four transistors Tr1 through Tr4, the added transfer transistor Tr4 corresponds to the transistor (Tr) shown in the sectional views in Modifications 1 and 2. A photoelectric conversion section 23*a* is connected through a pixel electrode to one of source/drain regions of the transfer transistor Tr4.

The transfer transistor Tr4 is provided between the photoelectric conversion section 23*a* and the reset transistor Tr1. The transfer transistor Tr4 has a gate electrode thereof connected to a transfer line 11-3, which is one of pixel drive lines 11. In addition, the transfer transistor Tr4 has one of source/drain regions thereof connected to the photoelectric conversion section 23*a*. Further, the transfer transistor Tr4 has the other of the source/drain regions thereof connected, at a floating diffusion FD, to the gate electrode of the amplification transistor Tr2 and to the reset transistor Tr1.

In the pixel circuit as above, a signal charge at the floating diffusion FD is reset by application of a reset signal RST from the reset line 11-1. Thereafter, application of a transfer signal TG from a transfer line 11-3 results in that signal charges from the photoelectric conversion sections 23*a* of the pixels which share the transfer line 11-3 are sequentially read out. Subsequently, application of a selection signal SEL from the selection line 11-2 results in that the signal charges from the pixels which share the selection line 11-2 are sequentially read out to the vertical signal line 13.

8. Modification 3

Figure 8:
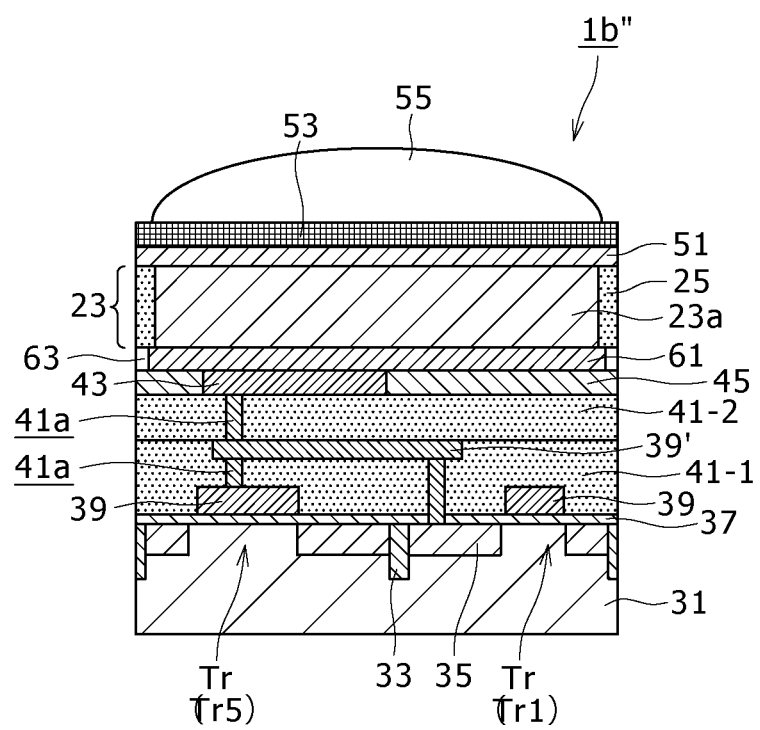
FIG. 8 is a major part sectional view showing the configuration of modification 3 of the embodiment of the present technology.

FIG. 8 is a major part sectional view for illustrating the configuration of a solid-state imaging device 1*b*" as a modification of the second embodiment. The solid-state imaging device 1*b*' shown in the figure is the same in configuration as that of the second embodiment, except that the pixel electrode 43, 61 bonded to the photoelectric conversion section 23*a* is connected to a source/drain region 35 of a transistor Tr and a gate electrode 39 of an adjacent transistor Tr, the two transistors Tr constituting the pixel circuits.

The solid-state imaging device 1*b*" configured as above can be manufactured in the same manner as in the second embodiment, except that the layout of elements and wiring is changed, in the driving circuit forming step described using FIG. 3B in the second embodiment above. Accordingly, effects equivalent or similar to those of the second embodiment can be obtained.

It is to be noted here, however, that in the driving circuit forming step, for example, as shown in FIG. 8, a multi-layer wiring is formed on the upper side of the second substrate 31, if desirable. In this case, after an electrode layer including a gate electrode 39 is formed over the second substrate 31, with a gate insulating film 37 therebetween, a first inter-layer dielectric film 41-1 is formed, then an intermediate wiring layer 39' is formed thereon, this structure is covered with a second inter-layer dielectric film 41-2, and a pixel electrode 43 is formed thereon in a pattern. It suffices for the multi-layer wiring structure having the intermediate wiring layer 39' to be formed according to an ordinary semiconductor process and a damascene process may be applied to the formation, like in other embodiments. Incidentally, such a multi-layer wiring structure can be applied, if desirable, also to the first embodiment, the second embodiment, and Modifications 1 and 2 thereof.

9. Example of Pixel Circuit Applied to Modification 3

Figure 9:
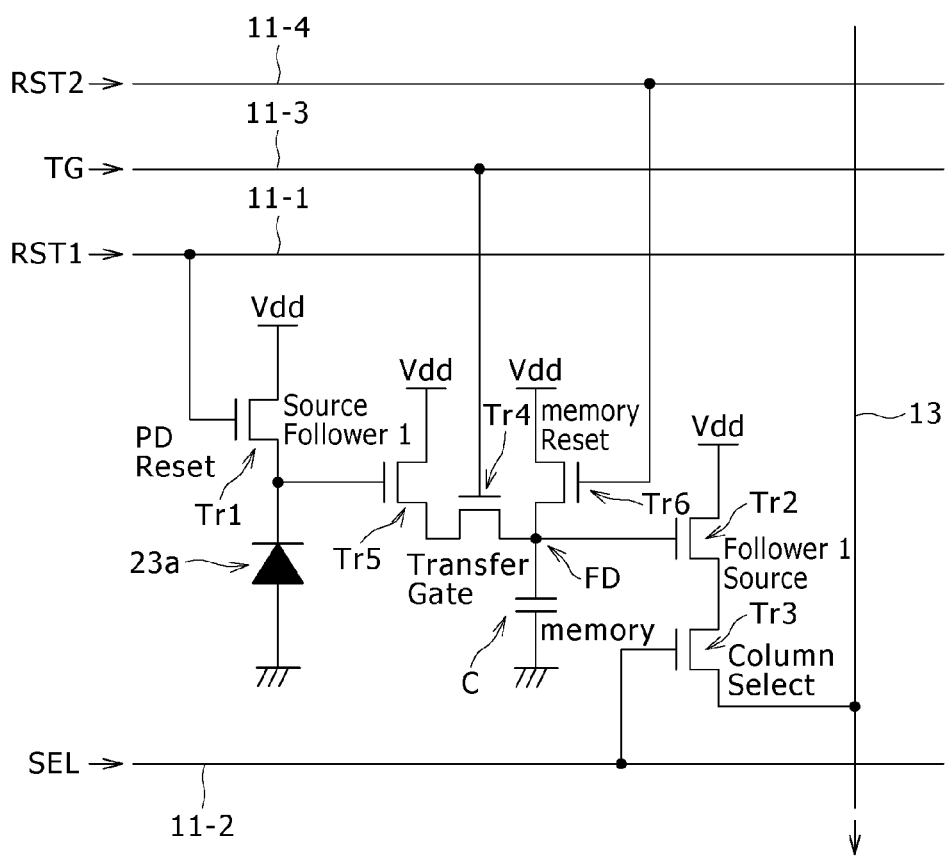
FIG. 9 is a diagram showing an example of a driving circuit provided in a solid-state imaging device according to modification 3.

FIG. 9 is a major part circuit diagram showing a part of a pixel circuit provided in the solid-state imaging device 1*b*" of Modification 3, showing an example of a pixel circuit having a global shutter function. Incidentally, the pixel circuit is a circuit disposed in an imaging area, and is a circuit constituting a part of a driving circuit provided in the solid-state imaging device 1b." In addition, the pixel circuit having the global shutter function applied to the present technology is not restricted to the configuration shown in FIG. 9, and various modifications are applicable.

The pixel circuit shown in FIG. 9 differs from the pixel circuit described using FIG. 7 above in that six transistors Tr1 through Tr6 including a second amplification transistor Tr5 and a second reset transistor Tr6 further added to the above-mentioned four transistors Tr1 through Tr4 are provided and a capacitance element C is provided. Of the six transistors Tr1 through Tr6, the reset transistor Tr1 and the second amplification transistor Tr5 corresponds to the transistor (Tr) shown in the sectional view in Modification 3.

The second amplification transistor Tr5 is provided between the photoelectric conversion section 23a as well as the reset transistor Tr1 and the transfer transistor Tr4. The second amplification transistor Tr5 has a gate electrode thereof connected to a point between the photoelectric conversion section 23a and the reset transistor Tr1. Besides, the second amplification transistor Tr5 has one of source/drain regions thereof connected to the power source voltage Vdd, and has the other of the source/drain regions thereof connected to a source/drain region of the transfer transistor Tr4.

The second reset transistor Tr6 is provided between the transfer transistor Tr5 and the amplification transistor Tr2. The reset transistor Tr6 has a gate electrode thereof connected to a second reset line 11-4, which is one of the pixel drive lines 11. Besides, the second reset transistor Tr6 has one of source/drain regions thereof connected to the power source voltage Vdd, and has the other of the source/drain regions thereof connected at a floating diffusion FD to a point between the transfer transistor Tr4 and the amplification transistor Tr2.

The capacitance element C has one of its electrodes connected to the floating diffusion FD, and has the other of its electrodes grounded.

In such a pixel circuit, a global shutter is configured in which two parts consisting of the floating diffusion FD and the capacitance element C are used as a recording section. In this instance, the floating diffusions FD in all the pixels are simultaneously reset by application of a second reset signal RST2 from the second reset line 11-4 to the second reset transistors Tr6. Thereafter, readout of a charge from the photoelectric conversion section 23a is performed simultaneously for all the pixels. In this way, the global shutter function is realized.

Figure 10:
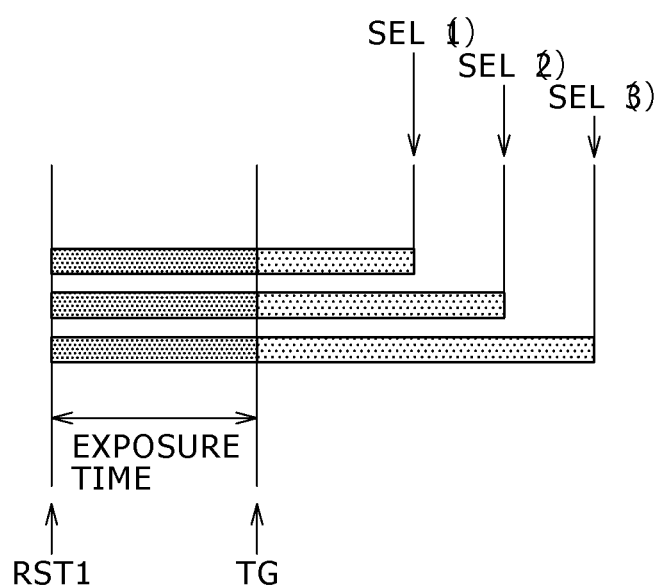
FIG. 10 is a diagram showing readout of signal charges by the driving circuits according to modification 3.

FIG. 10 shows a chart for illustrating the readout of signal charges corresponding to three pixels which share the vertical signal line 13. As shown in this chart, simultaneously for all the pixels, the signal charges in the photoelectric conversion sections 23a are reset by application of the reset signal ST1 from the reset line 11-1. Thereafter, simultaneously for all the pixels, an exposure time is started at the photoelectric conversion sections 23a. Next, when a predetermined exposure time is over, the signal charges obtained by photoelectric conversion in the photoelectric conversion sections 23a are held in the capacitance elements C by application of a transfer signal TG from the transfer line 11-3, simultaneously for all the pixels. Thereafter, the signal charges held in the capacitance elements C are read out to the vertical signal line 13 by application of a selection signal SEL from the selection line 11-2, on the basis of the pixels which share the selection line 11-2. In this instance, selection signals SEL(1), SEL(2), and SEL(3) are sequentially applied from the selection line 11-2 to the three pixels which share the vertical signal line 13, and the signal charges are read out to the vertical signal line 13 with different timings.

10. Third Embodiment

The solid-state imaging device according to any of the above-described embodiments of the present technology is applicable to electronic apparatuses such as camera systems, e.g., digital cameras and video cameras, cell phones having an imaging function, and other apparatuses having an imaging function.

Figure 11:
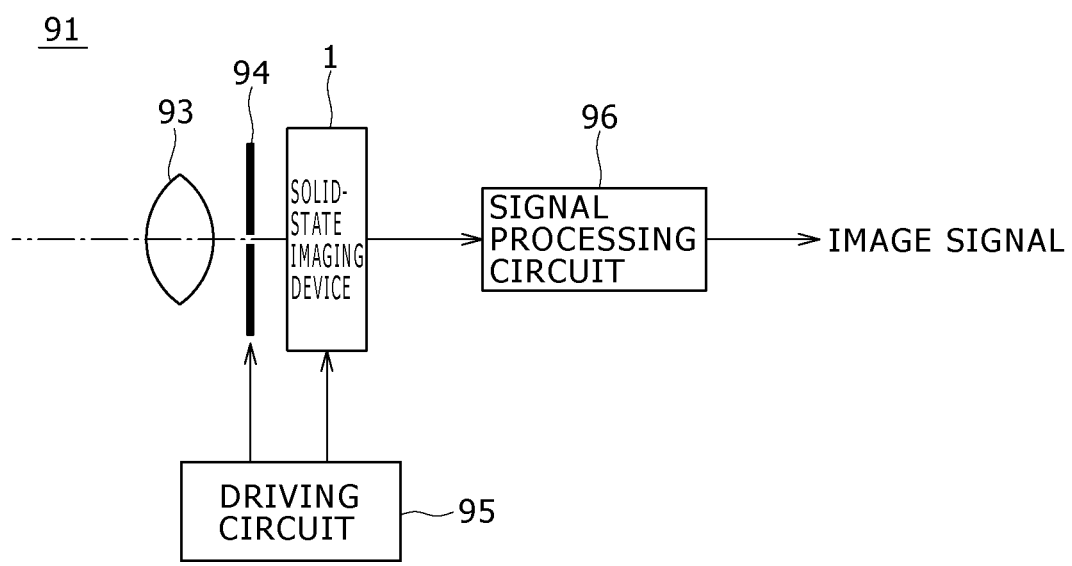
FIG. 11 is a block diagram of an electronic apparatus according to a third embodiment of the present technology.

FIG. 11 shows a block diagram of a camera using the solid-state imaging device, as an example of the electronic apparatus according to an embodiment of the present technology. The camera according to this embodiment is exemplified as a video camera capable of sensing still images and moving images. The camera 91 according to this embodiment includes a solid-state imaging device 1, an optical system 93 for guiding incident light to a light-receiving section of the solid-state imaging device 1, a shutter device 94, a driving circuit 95 for driving the solid-state imaging device 1, and a signal processing circuit 96 for processing an output signal from the solid-state imaging device 1.

As the solid-state imaging device 1, any of the solid-state imaging devices (1a, 1a', 1b, 1b', 1b'') described in the embodiments and modifications above is applicable. The optical system (optical lens) 93 condenses image light (incident light) from a subject to form an image on an imaging plane of the solid-state imaging device 1. As a result, signal charges are accumulated inside the solid-state imaging device 1 for a predetermined period of time. The optical system 93 may be an optical lens system having a plurality of optical lenses. The shutter device 94 controls a light irradiation period and a light blocking period for the solid-state imaging device 1. The driving circuit 95 supplies driving signals for controlling a transfer operation of the solid-state imaging device 1 and a shutter operation of the shutter device 94. The driving signal (timing signal) supplied from the driving circuit 95 causes the solid-state imaging device 1 to perform signal transfer. The signal processing circuit 96 performs a variety of signal processing. An image signal obtained upon the signal processing is stored in a storage medium such as memory, or is outputted to a monitor.

According to the electronic apparatus pertaining to this embodiment as above-described, images with high image quality can be obtained, since the solid-state imaging device 1 excellent in photoelectric conversion efficiency is used.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2010-273706 filed in the Japan Patent Office on Dec. 8, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state imaging device, comprising:
   forming a semiconductor thin film on a first substrate;
   forming isolation regions spanning an entire thickness of the semiconductor thin film such that the semiconductor thin film is provided with distinct photoelectric conversion sections;
   forming driving circuits and an interlayer dielectric film on a second substrate, the interlayer dielectric film comprising contact holes;
   forming first pixel electrodes over the interlayer dielectric film such that the first pixel electrodes are not embedded within the interlayer dielectric film, the first pixel electrodes being connected to corresponding gate electrodes of the driving circuits via the contact holes, each of the first pixel electrodes covering at least portions of a respective gate electrode, a respective source region, and a respective drain region;
   forming second pixel electrodes on the semiconductor thin film;
   laminating the first substrate and the second substrate together with the photoelectric conversion sections and isolation regions of the first substrate facing the first pixel electrodes of the second substrate such that (a) each first pixel electrode is in contact with a respective second pixel electrode and overlaps a respective photoelectric conversion section, (b) each second pixel electrode is spaced from the interlayer dielectric film, and (c) the semiconductor thin film is connected to the driving circuits; and
   removing the first substrate from the semiconductor thin film such that the photoelectric conversion sections and the isolation regions remain secured to the second substrate.

2. The method according to claim 1, further comprising forming the semiconductor thin film by epitaxial growth on the first substrate, the first substrate being a single crystal material.

3. The method according to claim 2, further comprising:
   connecting the distinct photoelectric conversion sections to the driving circuits while performing the lamination.

4. The method according to claim 3, further comprising:
   connecting the driving circuits to the semiconductor thin film with the second pixel electrodes while performing the lamination.

5. The method according to claim 4, wherein the second pixel electrodes are each formed on the basis of each of the distinct photoelectric conversion sections so as to cover a whole surface of the respective photoelectric conversion section.

6. The method according to claim 1, further comprising forming a protective film on an upper side of the semiconductor thin film after the removal of the first substrate.

7. The method according to claim 6, wherein the protective film is a material having a fixed charge.

8. The method according to claim 7, wherein the material having the fixed charge is a transparent electrode.

9. The method of claim 7, wherein the material having the fixed charge is silicon oxide with an impurity, hafnium oxide, zirconium oxide, aluminum oxide, titanium oxide, or tantalum oxide.

10. The method according to claim 1, wherein the driving circuits comprise a global shutter circuit.

11. The method of claim 1, wherein the isolation regions are formed by implanting ions into the semiconductor thin film.

12. A solid-state imaging device comprising:
   driving circuits on a substrate;
   an interlayer dielectric film comprising contact holes on the substrate;
   respective first pixel electrodes disposed over a surface of the interlayer dielectric film such that the first pixel electrodes are not embedded within the interlayer dielectric film, the first pixel electrodes being connected to corresponding gate electrodes of the driving circuits via the contact holes, each of the first pixel electrodes covering at least portions of a respective gate electrode, a respective source region, and a respective drain region;
   respective isolated photoelectric conversion sections of a semiconductor thin film secured on the substrate, the photoelectric conversion sections being respectively connected to the driving circuits; and
   respective second pixel electrodes between the first pixel electrodes and the photoelectric conversion sections, each second pixel electrode being in contact with a respective first pixel electrode and being spaced from the interlayer dielectric film, each second pixel electrode covering a whole surface of the respective photoelectric conversion section wherein each of the first pixel electrodes is smaller in plan view than the respective photoelectric conversion section.

13. The solid-state imaging device of claim 12, wherein each of the second pixel electrodes, in plan view, has a same shape as the respective photoelectric conversion section.

14. The solid-state imaging device of claim 12, wherein the semiconductor thin film comprises a crystalline chalcopyrite structure.

15. An electronic apparatus comprising:
   a solid-state imaging device;
   an optical system operable to guide incident light to an imaging area of the solid-state imaging device; and
   a signal processing circuit operable to process an output signal from the solid-state imaging device,
   wherein,
   the solid-state imaging device includes
   (a) an array of driving circuits on a substrate,
   (b) an interlayer dielectric film comprising contact holes on the substrate;
   (c) respective first pixel electrodes disposed over a surface of the interlayer dielectric film such that the first pixel electrodes are not embedded within the interlayer dielectric film, the first pixel electrodes being connected to corresponding gate electrodes of the driving circuits via the contact holes, each of the first pixel electrodes covering at least portions of a respective gate electrode, a respective source region, and a respective drain region, and
   (d) respective isolated photoelectric conversion sections of a semiconductor thin film secured on the substrate, the photoelectric conversion sections being connected to the driving circuits, and
   (e) respective second pixel electrodes between the first pixel electrodes and the photoelectric conversion sections, each second pixel electrode being in contact with a respective first pixel electrode and being spaced from the interlayer dielectric film, each second pixel electrode covering a whole surface of the respective photoelectric conversion section wherein each of the first pixel electrodes is smaller in plan view than the respective photoelectric conversion section.

* * * * *